(12) United States Patent
Watanabe (10) Patent No.: US 7,781,338 B2
(45) Date of Patent: Aug. 24, 2010

(54) SEMICONDUCTOR DEVICE MANUFACTURING METHOD AND SEMICONDUCTOR DEVICE

(75) Inventor: Kiyonori Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 226 days.

(21) Appl. No.: 12/073,195

(22) Filed: Mar. 3, 2008

(65) Prior Publication Data

US 2008/0217772 A1 Sep. 11, 2008

(30) Foreign Application Priority Data

Mar. 5, 2007 (JP) ............................. 2007-054398

(51) Int. Cl.
*H01L 21/44* (2006.01)
(52) U.S. Cl. ................. 438/666; 438/613; 257/773; 257/758; 257/786; 257/E23.019; 257/E21.575
(58) Field of Classification Search ............... 438/666, 438/613; 257/773, 758, 786, E23.019, E21.575
See application file for complete search history.

(56) References Cited

U.S. PATENT DOCUMENTS

2001/0051421 A1 * 12/2001 Watanabe .................... 438/613
2006/0292851 A1 * 12/2006 Lin et al. .................... 438/618

FOREIGN PATENT DOCUMENTS

| JP | 2000-183089 | 6/2000 |
|---|---|---|
| JP | 2002-289738 | 10/2002 |
| JP | 2003-060120 | 2/2003 |
| JP | 2004-281614 | 10/2004 |

* cited by examiner

*Primary Examiner*—Tu-Tu V Ho
(74) *Attorney, Agent, or Firm*—Rabin & Berdo, PC (57) ABSTRACT

The present invention provides a method for forming a semiconductor device, which comprises the steps of preparing a semiconductor wafer including an electrode pad, an insulating film formed with a through hole and a bedding metal layer which are formed in a semiconductor substrate, forming a first resist mask which exposes each area for forming a redistribution wiring, over the bedding metal layer, forming a redistribution wiring connected to the electrode pad and extending in an electrode forming area for a post electrode with the first resist mask as a mask, removing the first resist mask by a dissolving solution to expose each area excluding the electrode forming area for the redistribution wiring and forming a second resist mask disposed with being separated from each side surface of the redistribution wiring, forming a redistribution wiring protective metal film over upper and side surfaces of the exposed redistribution wiring with the second resist mask as a mask, removing the second resist mask by a dissolving solution, attaching a dry film over the semiconductor wafer and exposing the electrode forming area lying over the redistribution wiring, forming a post electrode in the electrode forming area with the dry film as a mask, removing the dry film by a removal solvent, and removing the redistribution wiring protective metal film after the removal of the dry film.

4 Claims, 8 Drawing Sheets

SEMICONDUCTOR DEVICE MANUFACTURING METHOD AND SEMICONDUCTOR DEVICE

BACKGROUND OF THE INVENTION

The present invention relates to a method for manufacturing a small-sized semiconductor device typified by a wafer level CSP (Chip Scale Package) formed by dividing a semiconductor wafer into each fraction, and a semiconductor device.

There has recently been an increasingly demand for miniaturization and thinning of a semiconductor device having an internal circuit in which a plurality of semiconductor elements are brought into integration. As to the semiconductor device that needs to make its thinning in particular, a CSP-type semiconductor device in which spherical bump electrodes each connected to an internal circuit thereof are disposed in grid or lattice form, is in the mainstream.

In a method for manufacturing such a CSP-type conventional semiconductor device, an internal circuit is formed on the front surface of a semiconductor substrate of a semiconductor wafer. Each electrode pad electrically connected to the internal circuit is provided on an insulating layer formed on the front surface. After a surface protective film has covered over the electrode pad and the insulating layer, the surface protective film provided on the electrode pad is removed by etching to form an insulating film made of polyimide on the surface protective film. A through hole that reaches the electrode pad is formed by etching the insulating film.

A bedding metal layer is formed on the electrode pad and the insulating film by a sputtering method. With a resist mask formed by photolithography as a mask, an about 5 μm-thick redistribution wiring made of copper (Cu), which extends from above the electrode pad to above a post-electrode forming electrode forming area, is formed on the bedding metal layer by an electroplating method. Each post electrode of about 100 μm is formed of copper or the like by the electroplating method using a resist mask thick in thickness, which has exposed the electrode forming area lying on the corresponding redistribution wiring. The bedding metal layer excluding below each redistribution wiring is removed by wet etching. Thereafter, the corresponding semiconductor wafer is inserted into an encapsulation mold and a sealing resin such as an epoxy resin is injected to the entire surface on the front surface side of the semiconductor substrate to form a sealing layer. A post end surface of each post electrode is exposed to its front surface. The semiconductor wafer in which each of hemispherical bump electrodes is formed on the post end surface, is divided into each fraction, whereby the corresponding semiconductor device is manufactured (refer to, for example, a patent document 1 (Japanese Unexamined Patent Publication No. 2003-60120 (mainly paragraph 0047 in the 6th page—paragraph 0066 in the 7th page, and FIGS. 7 through 10)).

Since the thick resist mask for forming each post electrode in the patent document 1 has a maximum thickness equivalent to a thickness of 30 μm or in the case of a liquid resist, a resist mask forming process step is required plural times. With this view, it has been generally practiced to attach a dry film having photosensitivity and subject it to exposure and development by photolithography thereby to expose the electrode forming area lying on the corresponding redistribution wiring.

When a powerful solvent is used to remove the attached dry film, an influence exerted on the environment occurs. Therefore, if a removal solvent friendly to the environment is used, then dry-film residues occur in the neighborhood of a base of each post electrode and between the adjacent redistribution wirings, thereby causing a short circuit due to a failure in etching of the bedding metal layer at a bedding metal layer etching step, whereby the reliability of the semiconductor device might be degraded.

In order to eliminate the film residues in such a conventional semiconductor device manufacturing method, a dry film is attached onto the corresponding bedding metal layer inclusive of each redistribution wiring after the formation of the redistribution wiring in a manner similar to the above. The electrode forming area lying on the redistribution wiring is exposed by photolithography. Each post electrode is formed by copper or the like according to an electroplating method, and the dry film is peeled off by a resist peeling liquid. Thereafter, steam of 120° C. or higher is sprayed onto the semiconductor wafer thereby to eliminate the film residues that remain on then outer peripheral surface of the base of the post electrode and a connecting pad at its periphery (refer to, for example, a patent document 2 (Japanese Unexamined Patent Publication No. 2004-281614 (mainly paragraphs 0010-0017 in the 3rd page and FIG. 4).

With the recent miniaturization of the semiconductor device, miniaturization has been promoted even in the case of the CSP-type semiconductor device. Redistribution wrings for connecting between bump electrodes disposed in grid form and electrode pads each electrically connected to a predetermined portion of an internal circuit while being shifted, have been brought into micro-fabrication, and the wiring-interval narrowing of making the interval between the adjacent redistribution wirings narrower has been performed.

The technology of the above patent document 2, however, needs to introduce new cleaning equipment for injecting high-temperature steam because the steam of 120° C. or higher is sprayed onto the semiconductor wafer to eliminate the film residues. Thus, a problem arises in that heavy burdens such as equipment costs therefor, a change in production line and the like occur.

Since the steam of 120° C. or higher is sprayed onto the semiconductor wafer to eliminate the film residues that remain on the outer peripheral surface of the base of each post electrode and the connecting pad at its periphery, there is a case in which when the wiring interval between the redistribution wirings is narrow, e.g., 30 μm or less, it is difficult to eliminate the film residues mechanically sandwiched between the redistribution wirings. Thus, a problem arises in that there is a fear that a short circuit produced by the bedding metal layer having remained due to a failure in etching of the bedding metal layer due to the film residues occurs and the reliability of the semiconductor device is hence degraded.

This is especially prominent in the semiconductor device having the redistribution wirings narrowed in wiring interval.

SUMMARY OF THE INVENTION

The present invention has been made to solve the above problems. It is an object of the present invention to provide means that prevents a short circuit produced due to the remaining of a bedding metal layer lying between redistribution wirings and enhances the reliability of a semiconductor device.

According to one aspect of the present invention, for attaining the above object, there is provided a method for manufacturing a semiconductor device including a semiconductor substrate, an electrode pad electrically connected to an internal circuit formed in the semiconductor substrate, an insulating film formed with a through hole reaching the electrode pad, a bedding metal layer formed over an internal surface of the through hole and the insulating film, a redistribution wiring electrically connected to the electrode pad via the bedding metal layer interposed therebetween and extended over the bedding metal layer, and a post electrode formed over the redistribution wiring, said method comprising the steps of preparing a semiconductor wafer including the electrode pad, the insulating film formed with the through hole and the bedding metal layer which are formed in the semiconductor substrate, forming a first resist mask which exposes each area for forming the redistribution wiring, over the bedding metal layer, forming a redistribution wiring connected to the electrode pad and extending in an electrode forming area for the post electrode with the first resist mask as a mask, removing the first resist mask by a dissolving solution to expose each area excluding the electrode forming area for the redistribution wiring and forming a second resist mask disposed with being separated from each side surface of the redistribution wiring, forming a redistribution wiring protective metal film over upper and side surfaces of the exposed redistribution wiring with the second resist mask as a mask, removing the second resist mask by a dissolving solution, attaching a dry film over the semiconductor wafer and exposing the electrode forming area lying over the redistribution wiring, forming a post electrode in the electrode forming area with the dry film as a mask, removing the dry film by a removal solvent, and removing the redistribution wiring protective metal film after the removal of the dry film.

Thus, the present invention can obtain advantageous effects in that a redistribution wiring protective metal film is removed to enable reliable removal of film residues sandwiched between redistribution wirings, and a short circuit produced by a bedding metal layer having remained between the redistribution wirings is prevented to make it possible to enhance the reliability of a semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a semiconductor device manufacturing method and a semiconductor device according to the present invention will hereinafter be described with reference to the accompanying drawings.

First Preferred Embodiment

FIG. 1A to FIG. 1E and FIG. 2A to FIG. 2C are respectively explanatory views showing a method for manufacturing a semiconductor device, according to a first embodiment.

Incidentally, the respective drawings shown in FIG. 1A to FIG. 1E and FIG. 2A to FIG. 2C are partly sectional views showing a redistribution wiring formed with an electrode pad formed in a semiconductor wafer and a post electrode electrically connected to the electrode pad, and the neighborhoods of redistribution wirings adjacent to the redistribution wiring (other drawings are the same as above).

In FIG. 1A to FIG. 1E and FIG. 2A to FIG. 2C, reference numeral 1 indicates a semiconductor wafer, which is a semiconductor wafer for manufacturing a plurality of CSP-type semiconductor devices 2 simultaneously.

Reference numeral 3 indicates a semiconductor substrate made of silicon (Si), of the semiconductor wafer 1, which includes an internal circuit formed in its front surface, having a plurality of unillustrated semiconductor elements.

Reference numeral 4 indicates an insulating layer, which is formed by depositing an insulating material such as silicon dioxide ($SiO_2$) on the front surface of the semiconductor substrate 3 by a CVD (Chemical Vapor Deposition) method or the like. An unillustrated contact hole made open at a predetermined portion or region of the internal circuit of the semiconductor substrate 3 is formed in the insulating layer.

Reference numeral 5 indicates an electrode pad, which is an electrode formed by etching a conductive layer formed of a conductive material such as aluminum (Al) or aluminum containing silicon in a predetermined shape by a sputtering method or the like. The electrode pad 5 is electrically connected to its corresponding predetermined portion of the internal circuit via a conductor embedded into the contact hole of the insulating layer 4.

Reference numeral 6 indicates a surface protective film, which is a protective film that covers over the insulating layer 4 formed by depositing an insulating material such as silicon nitride ($Si_3N_4$) by the CVD method or the like, and the edge portions of the electrode pad 5.

Reference numeral 7 indicates an insulating film, which is a film having a thickness of about 5 μm to 10 μm, which is formed by applying an insulating resin material such as polyimide having positive or negative photosensitivity and insulating properties onto the surface protective film 6, subjecting the same to exposure and development processing to form a through hole 8 or the like and thereafter solidifying the same by heat treatment.

The through hole 8 is an opening that exposes the electrode pad 5 at its bottom and reaches on the electrode pad 5 through the insulating film 7.

Reference numeral 9 indicates a bedding metal layer (first bedding metal layer), which is a metal thin-film layer formed by laminating a conductive material such as titanium (Ti), titanium nitride (TiN), copper (Cu) or the like over the entire surface on the front surface side, of the semiconductor substrate 3 of the semiconductor wafer 1 by the sputtering method or the like. The bedding metal layer 9 covers over the insulating film 7 and over both the internal surface of the through hole 8 and the electrode pad 5 at its bottom, etc.

Reference numeral 10 indicates each redistribution wiring corresponding to a wiring pattern extended over the insulating film 7 via the bedding metal layer 9 interposed therebetween, which is formed by masking areas excluding areas for forming a redistribution wiring 10 reaching from above the electrode pad 5 for the bedding metal layer 9 to an area (called "electrode forming area 12") for forming a post electrode 11 connected to the electrode pad 5, a redistribution wiring 10 connecting between the corresponding electrode pads 5, and the like by photolithography or the like and electrodepositing a conductive material such as copper onto the exposed bedding metal layer 9 by an electroplating method with the bedding metal layer 9 as one common electrode. The redistribution wiring 10 is electrically connected to the electrode pad 5 via the bedding metal layer 9 by means of the conductive material embedded into the through hole 8. The redistribution wiring 10 has the function of electrically connecting between the electrode pad 5 and the post electrode 11 and between the adjacent electrode pads 5.

The post electrode 11 is a columnar electrode formed by masking an area excluding the electrode forming area 12 lying on the redistribution wiring 10 by a dry film 19 to be described later, and electrodepositing a material similar to the redistribution wiring 10 onto the exposed redistribution wiring 10 by the electroplating method with the bedding metal layer 9 as one common electrode.

Reference numeral 14 indicates an encapsulating or sealing layer, which is formed by heating and curing a sealing resin such as an epoxy resin having a thermosetting property and an insulating property, which is applied to or injected into the front surface side of the semiconductor substrate 3 of the semiconductor wafer 1. The sealing layer 14 covers over the insulating film 7, bedding metal layer 9 and redistribution wiring 10 formed on the front surface side of the semiconductor substrate 3 of the semiconductor wafer 1, and the side surfaces of the post electrode 11. The sealing layer 14 is formed with a post end surface of the post electrode 11 being exposed at the front surface.

Reference numeral 15 indicates a bump electrode, which is a hemispheric electrode formed by solder or the like on its corresponding post end surface of the post electrode 11 by a solder ball method or a screen printing method or the like. The bump electrode 15 is bonded to its corresponding wiring terminal of an unillustrated mounting board and functions as an external terminal of the semiconductor device 2. Thus, the internal circuit formed in the semiconductor substrate 3 is connected to an external device via the electrode pad 5, bedding metal layer 9, redistribution wiring 10, post electrode 11 and bump electrode 15.

Reference numeral 16 indicates a first resist mask, and reference numeral 17 indicates a second resist mask. They are mask members each formed by exposing a novolac liquid resist having photosensitivity applied onto to the front surface side of the semiconductor substrate 3 of the semiconductor wafer 1 by photolithography and thereafter subjecting the same to development processing. They are dissolved and removed relatively easily with a dissolving solution such as acetone, alcohol or the like.

Figure 1A:
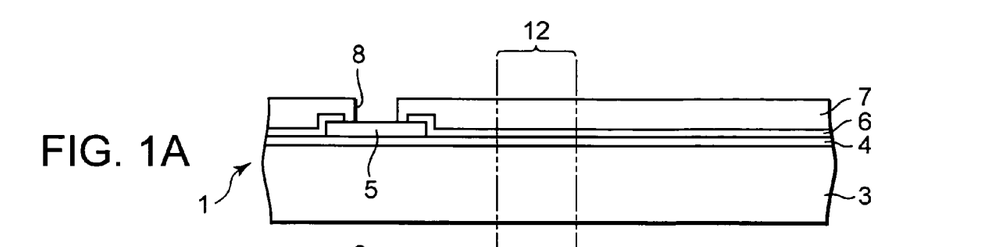
FIG. 1A to FIG. 1E are an explanatory view showing a method for manufacturing a semiconductor device according to a first embodiment.
Figure 1B:
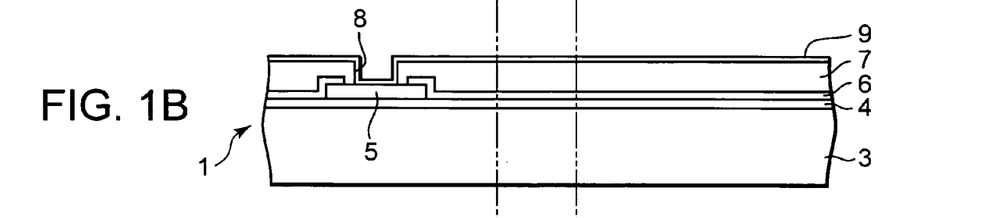
Figure 1C:
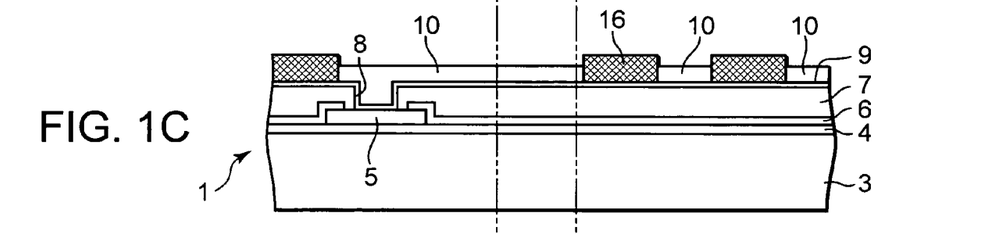
Figure 1D:
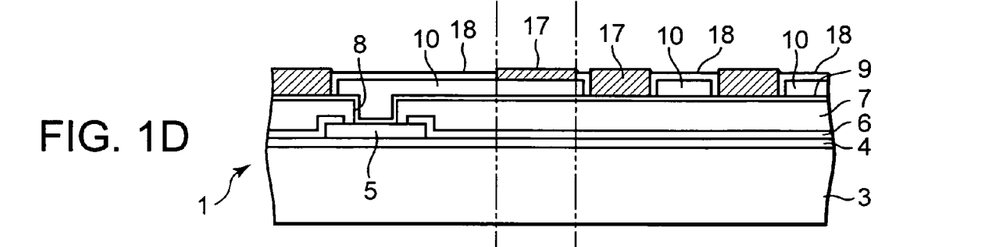

In the present embodiment, each first resist mask is crosshatched and each second resist mask is hatched for distinctions (refer to FIG. 1C and FIG. 1D).

Reference numeral 18 indicates a redistribution wiring protective metal film, which is a metal film formed on the upper and side surfaces excluding the electrode forming area 12 on the redistribution wiring 10 by means of a metal capable of selectively removing the post electrode 11, redistribution wiring 10 and bedding metal layer 9. The redistribution wiring protective metal film 18 is formed by the electroplating method with the bedding metal layer 9 as one common electrode, and is then dissolved and removed by wet etching.

In the present embodiment, tin (Sn) is used as the metal for forming each redistribution wiring protective metal film 18, and potassium hydroxide (KOH) is used as an etchant.

Figure 2A:
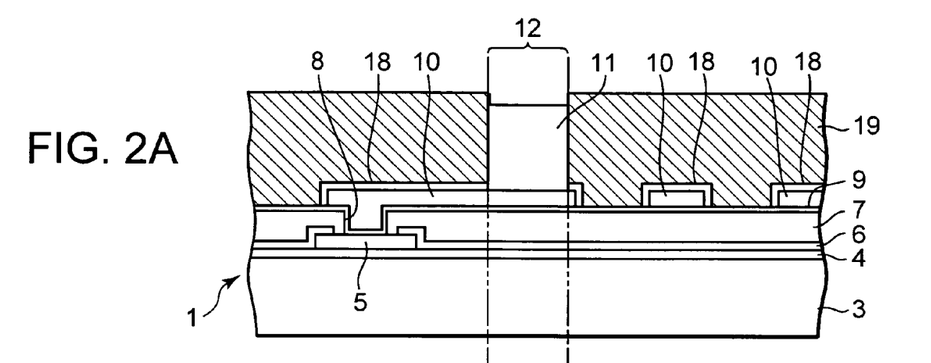
FIG. 2A to FIG. 2C are an explanatory view illustrating the method for manufacturing the semiconductor device according to the first embodiment.

The dry film 19 is a mask member shown with being hatched in FIG. 2A, made of an acrylic film having photosensitivity, which is attached on the redistribution wiring 10 formed on the front surface of the semiconductor wafer 1, and the bedding metal layer 9 lying between the redistribution wirings 10. The dry film is formed with an opening or the like by photolithography and removed with removal solvents friendly to the environment.

In the present embodiment, as the removal solvent friendly to the environment, one selected from the following solvents is used.

(1) Diethyleneglycolmonobutylether: 65 wt %, monoethanolamine:mixed solution of 35 wt %

(2) Dimethyl Sulfoxide: 77 wt %, Polyalcohol:11 wt %, N-methyl-2-pyrrolidone:10 wt %, Organic alkali:mixed solution of 2 wt %

(3) Diethylenediamine: 30 wt %, Stabilizer:10 wt %, mixed solution of water 60 wt %

(4) Organic alkali: 64 wt %, Amine:30 wt %, Separation accelerator:mixed solution of 6 wt %, etc.

The semiconductor device manufacturing method according to the present embodiment will be explained below in accordance with processes indicated by P in FIG. 1A to FIG. 1E and FIG. 2A to FIG. 2C.

At FIG. 1A, an internal circuit having a plurality of unillustrated semiconductor elements is formed on the front surface of a semiconductor substrate 3 of a semiconductor wafer 1. An insulating layer 4 provided with an unillustrated contact hole made open at each predetermined portion of the internal circuit is formed thereon. Thereafter, a conductive layer made of aluminum is formed on the insulating layer 4 by a sputtering method. This is etched to a predetermined shape, thereby forming an electrode pad 5 electrically connected to the predetermined portion of the internal circuit.

After the formation of the electrode pad 5, a surface protective film 6 made of silicon nitride is formed on the electrode pad 5 and the insulating layer 4 by a CVD method. The electrode pad 5 associated with the surface protective film 6 is etched from thereabove to expose the electrode pad 5. An insulating resin material comprised of polyimide having photosensitivity is applied onto the surface protective film 6 and the exposed electrode pad 5, after which a through hole 8 that extends through an insulating film 7 and reaches the electrode pad 5 is formed by photolithography. This is solidified by heat treatment to form the insulating film 7.

At FIG. 1B, a bedding metal layer 9 comprised of plural layers, which covers the internal surface of the through hole 8, containing over the insulating film 7 and over the electrode pad 5 at its bottom, is formed on the front surface side of the semiconductor substrate 3 of the semiconductor wafer 1 by the sputtering method.

At FIG. 1C, first resist masks 16 which expose areas for forming a redistribution wiring 10 extending from above the electrode pad 5 to above an electrode forming area 12 and each redistribution wiring 10 connecting between the electrode pads 5, are formed on the bedding metal layer 9 by photolithography. Copper is electrodeposited onto the exposed bedding metal layer 9 by an electroplating method with the bedding metal layer 9 as one common electrode, whereby the redistribution wiring 10 extending from above the electrode pad 5 to above the electrode forming area 12, and each redistribution wiring 10 connecting between the electrode pads 5 are formed.

At FIG. 1D, the first resist masks 16 formed at the process shown in FIG. 1C are removed using a dissolving solution. The areas excluding the electrode forming area 12 located on the redistribution wiring 10 are exposed again by photolithography, and second resist masks 17 disposed with being separated from the side surfaces of the redistribution wirings 10 are formed.

Thus, slit-shaped trenches or grooves whose bottoms are provided as the bedding metal layer 9 are formed around the redistribution wirings 10.

With each second resist mask 17 as a mask, tin is electrodeposited onto the upper and side surfaces of each exposed redistribution wiring 10 by the electroplating method with the bedding metal layer 9 as one common electrode to form a redistribution wiring protective metal film 18.

Figure 1E:
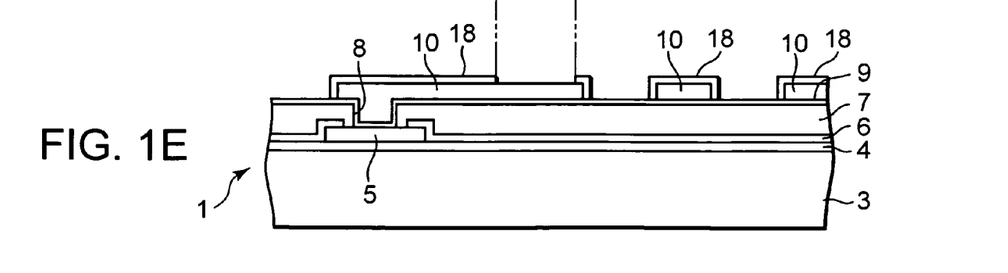

At FIG. 1E, after the formation of the redistribution wiring protective metal film 18, the second resist masks 17 formed at the process shown in FIG. 1D are removed using the dissolving solution.

Thus, each of the upper and side surfaces of the redistribution wirings 10 excepting the electrode forming area 12 is covered with the redistribution wiring protective metal film 18.

At FIG. 2A, a dry film 19 having photosensitivity is attached onto the redistribution wiring protective metal films 18 of the redistribution wirings 10 formed on the semiconductor wafer 1, i.e., the front surface side of the semiconductor wafer 1 and onto the bedding metal layer 9 lying between the redistribution wirings 10, which is interposed between the redistribution wiring protective metal films 18. The electrode forming area 12 located on the corresponding redistribution wiring 10 is exposed by photolithography. With it as a mask, copper is electrodeposited onto the exposed redistribution wiring 10 by the electroplating method with the bedding metal layer 9 is one common electrode to form a post electrode 11.

Figure 2B:
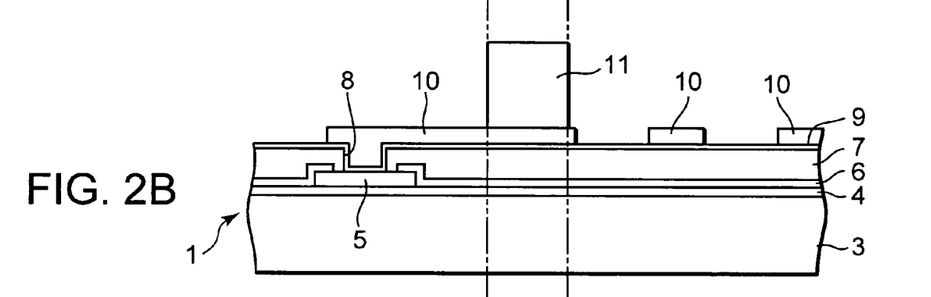

At FIG. 2B, the dry film 19 is removed using a removal solvent and thereafter the redistribution wiring protective metal films 18 are selectively dissolved and removed by wet etching using potassium hydroxide. Afterwards, cleaning is done to remove film residues.

Since the film residues are sandwiched between the redistribution wiring protective metal films 18 formed on the side surfaces of the redistribution wirings 10 even though the film residues mechanically sandwiched between the adjacent redistribution wirings 10 remain upon removal of the redistribution wiring protective metal films 18, mechanical binding of the film residues is released by the dissolution of each redistribution wiring protective metal film 18, so that the film residues sandwiched between the redistribution wirings 10 are removed. Along with it, the film residues adhered to a portion near the base of other post electrode 11 at the outer peripheral surface thereof are also removed by cleaning.

At FIG. 2C, after the removal of the film residues, the entire surface on the front surface side, of the semiconductor substrate 3 of the semiconductor wafer 1 is etched by wet etching to remove the bedding metal layer 9 in the areas except for below the redistribution wirings 10. An encapsulating or sealing resin made of a thermosetting epoxy resin is applied or injected so as to cover the entire surface on the front surface side, of the semiconductor substrate 3 of the semiconductor wafer 1, that is, cover over the insulating film 17 and the redistribution wirings 10 and the post electrode 11 or the like. This is heated and cured to form a sealing layer 14. The front surface side of the sealing layer 14 is ground to expose the post end surface of the post electrode 11 to the front surface of the sealing layer 14.

Flux is applied onto the post end surface exposed to the front surface of the sealing layer 14 to form a bump electrode 15 protruded in hemispherical form on the post end surface by a solder ball method.

The semiconductor wafer 1 formed with a plurality of semiconductor devices 2 prior to being divided into pieces or fractions is formed according to the above processes. By dividing the semiconductor wafer 1 into the fractions, the semiconductor device 2 according to the present embodiment is manufactured.

Thus, in the method for manufacturing the semiconductor device 2 according to the present embodiment, the redistribution wiring protective metal films 18 formed around the redistribution wirings 10 are dissolved after the removal of the dry film 19 to remove the film residues. Even though the dry film 19 is removed by the removal solvent friendly to the environment, the film residues sandwiched between the redistribution wirings 10 can be removed reliably. It is thus possible to prevent a short circuit made by the bedding metal layer 9 lying between the redistribution wirings 10, which has remained due to a failure in etching of the bedding metal layer 9 with the removal of the film residues and to enhance the manufacturing yield of the semiconductor device 2. Along with it, the reliability of the semiconductor device can be enhanced. Besides, a contribution to environmental protection at the manufacture of the semiconductor device 2 can be done.

This is particularly effective for a small CSP-type semiconductor device 2 in which narrowing between the redistribution wirings 10 has been done.

In the present embodiment as described above, redistribution wiring protective metal films are formed around redistribution wirings extended on an insulating film via a bedding metal layer interposed therebetween. After the removal of a dry film subsequent to the formation of an electrode post, the redistribution wiring protective metal films are selectively removed by etching. Thus, the redistribution wiring metal films are selectively dissolved to make it possible to reliably remove film residues sandwiched between the redistribution wirings, and a short circuit produced by the bedding metal layer that has remained between the adjacent redistribution wirings is prevented, thereby making it possible to enhance the reliability of a semiconductor device.

Second Preferred Embodiment

FIG. 3A to FIG. 3D and FIG. 4A to FIG. 4C are respectively explanatory views showing a method for manufacturing a semiconductor device, according to a second embodiment.

Incidentally, the same reference numbers are attached to portions or components similar to those in the first embodiment, and their explanations are omitted.

The semiconductor device manufacturing method according to the present embodiment will be explained below in accordance with processes indicated by PA in FIG. 3A to FIG. 3D and FIG. 4A to FIG. 4C.

Since processes shown in FIG. 3A through FIG. 3D in the present embodiment are similar to those at the processes shown in FIG. 1A through FIG. 1C in the first embodiment, their explanations are omitted.

Figure 3A:
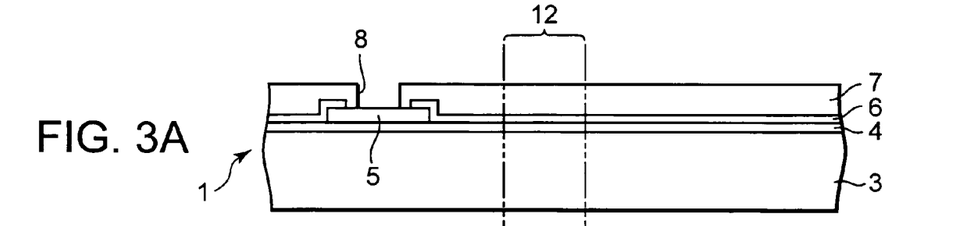
FIG. 3A to FIG. 3D are an explanatory view showing a method for manufacturing a semiconductor device according to a second embodiment.
Figure 3B:
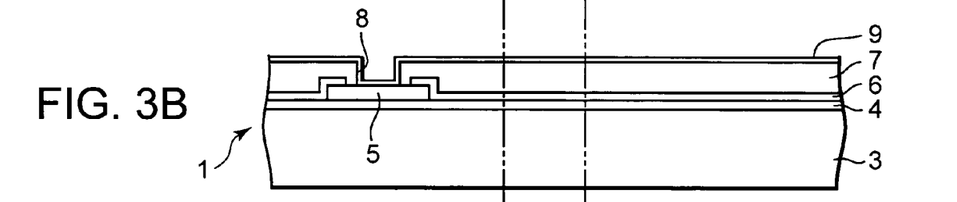
Figure 3C:
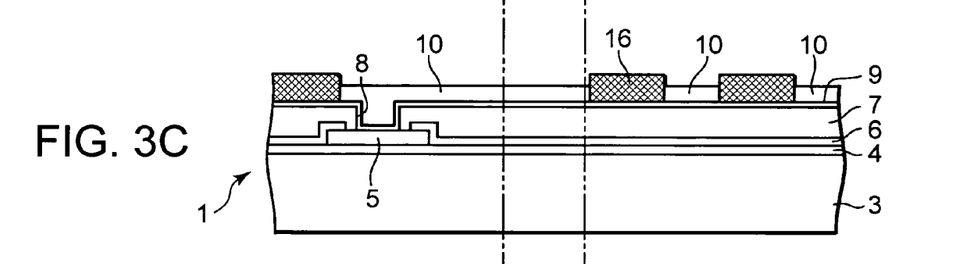
Figure 3D:
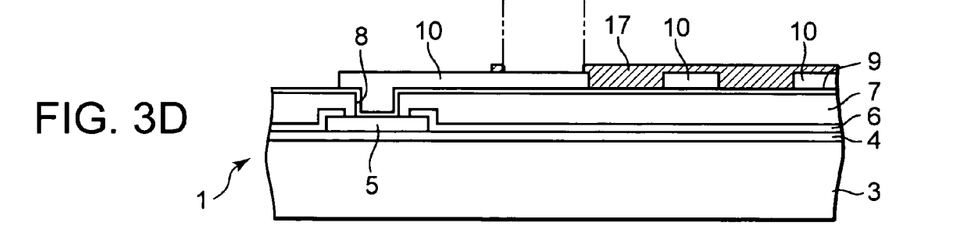

At FIG. 3D, first resist masks 16 formed at the process shown in FIG. 3C are removed using a dissolving solution. A second resist mask 17 is formed again by photolithography, which covers over a bedding metal layer 9 between redistribution wirings 10 narrow in wiring interval (30 μm or less in the present embodiment) and over the redistribution wirings 10 (right area in the drawing in the example of FIG. 3D), exposes an electrode forming area 12 for a post electrode 11 disposed on the corresponding redistribution wiring 10, and covers an area for the base of the post electrode 11 lying therearound.

Thus, the second resist mask 17 is embedded between the redistribution wirings 10 narrow in wiring interval.

Figure 4A:
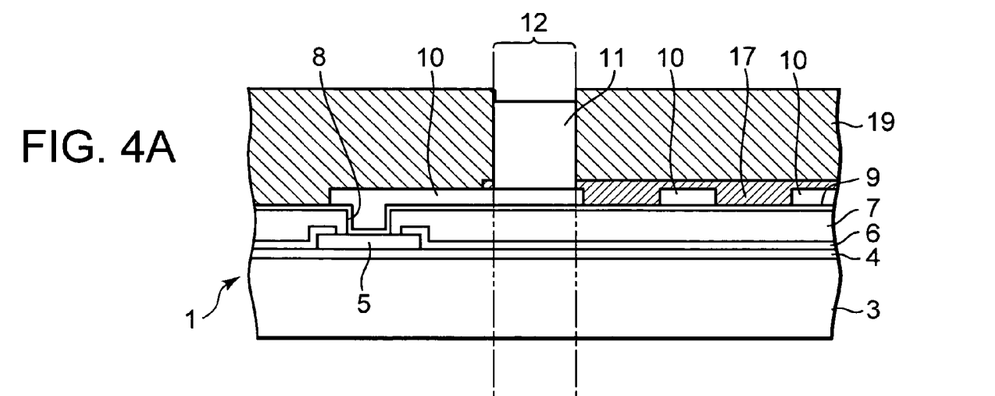
FIG. 4A to FIG. 4C are an explanatory view depicting the method for manufacturing the semiconductor device according to the second embodiment.

At FIG. 4A, a dry film 19 having photosensitivity is attached onto a semiconductor wafer 1 including the second resist mask 17, that is, it is attached onto the redistribution wiring 10 and a bedding metal layer 9 uncovered with the second resist mask 17 formed on the front surface side of the semiconductor wafer 1 and onto the second resist mask 17. In a manner similar to the process shown in FIG. 2A in the first embodiment, copper is electrodeposited onto the exposed redistribution wiring 10 to form the corresponding post electrode 11.

Figure 4B:
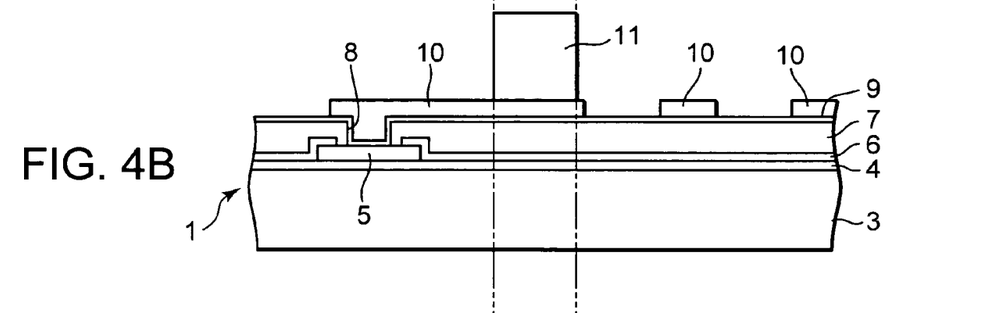

At FIG. 4B, the dry film 19 is removed using a removal solvent and thereafter the second resist mask 17 is dissolved and removed using a dissolving solution, after which cleaning is done to remove film residues.

Since, at this time, the second resist mask 17 is embedded between the redistribution wirings 10 narrow in wiring interval, the film residues are not sandwiched mechanically between the redistribution wirings 10. Even though the film residues remain on the second resist mask 17 and the second resist mask 17 in the neighborhood of the base of the post electrode 11 at its outer peripheral surface, the film residues are removed by dissolution of the second resist mask 17, and the film residues attached to other portions are also removed by cleaning.

Figure 2C:
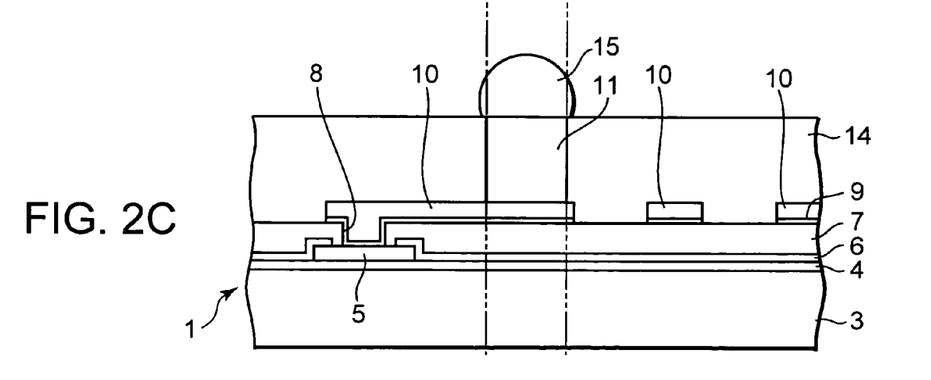
Figure 4C:
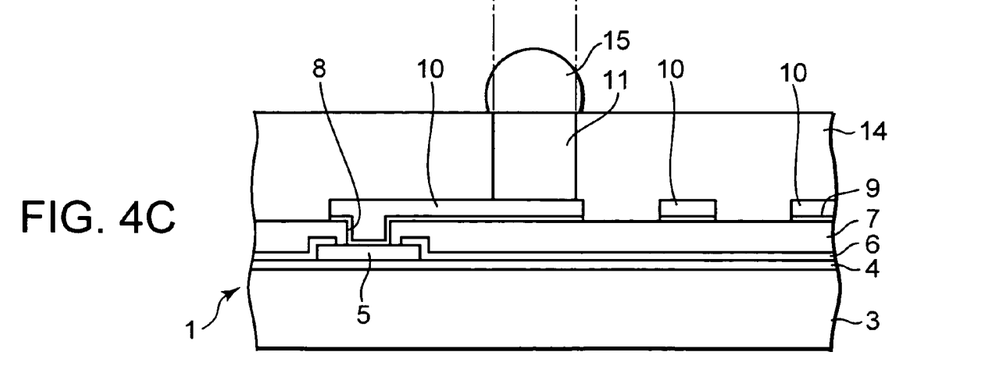

Since an operation at a subsequent process at FIG. 4C is similar to the operation at the process at FIG. 2C in the first embodiment, its description is omitted.

Thus, in the method for manufacturing the semiconductor device 2, according to the present embodiment, the easily dissoluble second resist mask 17 is embedded between the redistribution wirings 10 narrow in wiring interval prior to the attachment of the dry film 19. After the removal of the dry film 19, the second resist mask 17 embedded between the redistribution wirings 10 is dissolved to remove the film residues. Therefore, even though the dry film 19 is removed by the removal solvent friendly to the environment, the film residues are not sandwiched between the redistribution wirings 10. It is thus possible to prevent a short circuit produced by the bedding metal layer 9 lying between the redistribution wirings 10, which has remained due to a failure in etching of the bedding metal layer 9 with the removal thereof and to enhance the manufacturing yield of the semiconductor device 2. Along with it, the reliability of the semiconductor device 2 can be enhanced. Besides, a contribution to environmental protection at the manufacture of the semiconductor device 2 can be done.

This is particularly effective for a small CSP-type semiconductor device 2 in which narrowing between the redistribution wirings 10 has been done.

In the present embodiment as described above, a second resist film is formed, prior to the attachment of a dry film, between redistribution wirings narrow in wiring interval, of redistribution wirings extended over an insulating film via a bedding metal layer interposed therebetween. After the removal of the dry film subsequent to the formation of a post electrode, the second resist mask is removed by a dissolving solution. Thus, it is possible to dissolve the second resist mask between the adjacent redistribution wirings and thereby remove it easily without sandwiching the film residues between the redistribution wirings. Hence, a short circuit produced by the bedding metal layer having remained between the redistribution wirings is prevented and thereby the reliability of the semiconductor device can be enhanced.

It is possible to omit the process of forming the redistribution wiring protective metal film and thereby simplify the semiconductor device manufacturing method.

Third Preferred Embodiment

FIG. 5A to FIG. 5D and FIG. 6A to FIG. 6C are respectively explanatory views showing a method for manufacturing a semiconductor device, according to a third embodiment.

Incidentally, the same reference numerals are attached to portions similar to those in the first and second embodiments, and their explanations are omitted.

The semiconductor device manufacturing method according to the present embodiment will be explained below in accordance with processes indicated by PB in FIG. 5A to FIG. 5D and FIG. 6A to FIG. 6C.

Figure 5A:
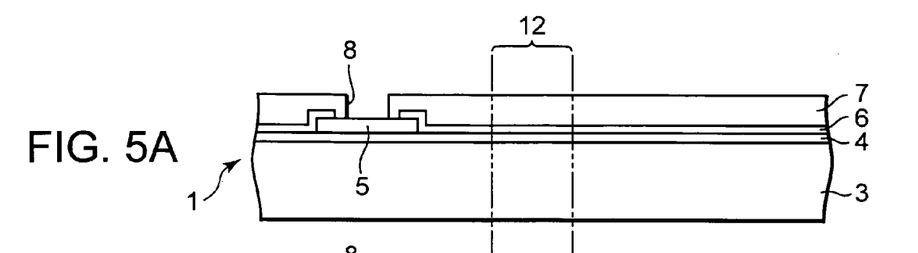
FIG. 5A to FIG. 5D are an explanatory view showing a method for manufacturing a semiconductor device according to a third embodiment.
Figure 5B:
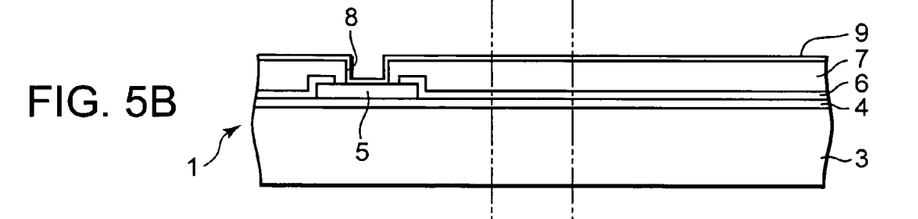
Figure 5C:
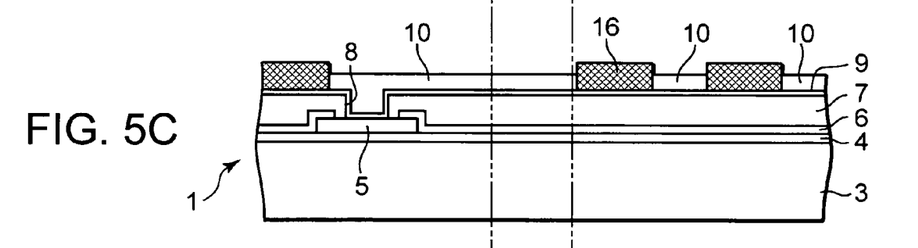

Since processes shown in FIG. 5A through FIG. 5C in the present embodiment are similar to those at the processes FIG. 1A through FIG. 1C in the first embodiment, their explanations are omitted.

Figure 5D:
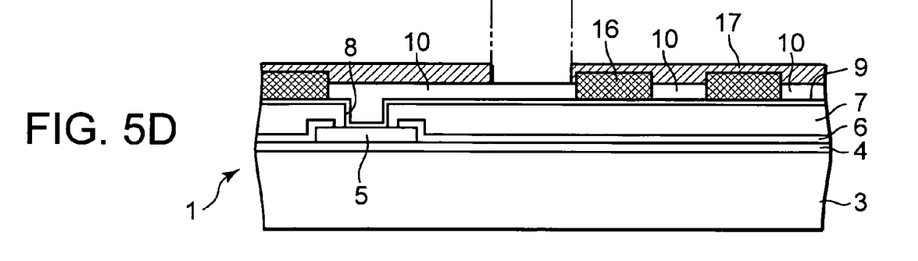

At FIG. 5D, a second resist mask 17 having exposed an electrode forming area 12 placed on a redistribution wiring 10 is formed again by photolithography without removing each first resist mask 16 formed at the process shown in FIG. 5C.

Thus, the first resist mask 16 is embedded between the redistribution wirings 10, and a second resist mask 17 is formed over the entire surface excluding the electrode forming area 12 on the front surface side of the semiconductor wafer 1.

Figure 6A:
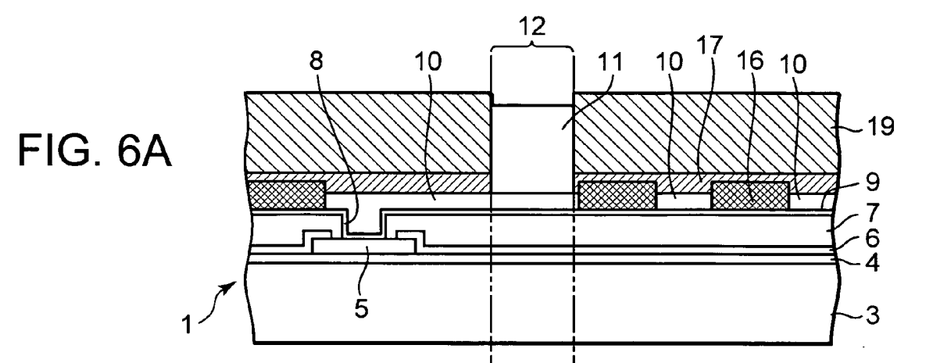
FIG. 6A to FIG. 6C are an explanatory view illustrating the method for manufacturing the semiconductor device according to the third embodiment.

At FIG. 6A, a dry film 19 having photosensitivity is attached onto the second resist mask 17. In a manner similar to the process shown in FIG. 2A in the first embodiment, copper is electrodeposited onto the corresponding exposed redistribution wiring 10 to form a post electrode 11.

Figure 6B:
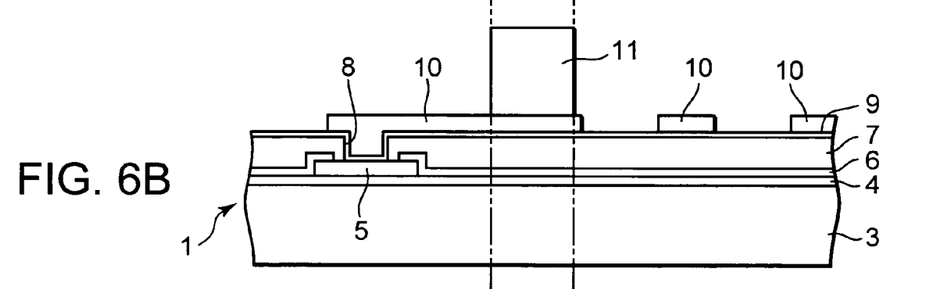

At FIG. 6B, the dry film 19 is removed using a removal solvent and thereafter the first and second resist mask 16 and 17 are dissolved and removed using a dissolving solution, after which cleaning is done to remove film residues.

Since, at this time, the first resist mask 16 is embedded between the redistribution wirings 10 and the second resist mask 17 covers over the redistribution wirings 10 and covers the neighborhood of the base of each post electrode 11, the film residues are not sandwiched mechanically between the redistribution wirings 10. Even though the film residues remain on the second resist mask 17, the film residues are removed by dissolution of the first and second resist masks 16 and 17. Thus, no film residues remain over a bedding metal layer 9 lying between the adjacent redistribution wirings 10 and at a portion in the neighborhood of the base of the post electrode 11 at its outer peripheral surface, and the film residues attached to other portions are also removed by cleaning.

Figure 6C:
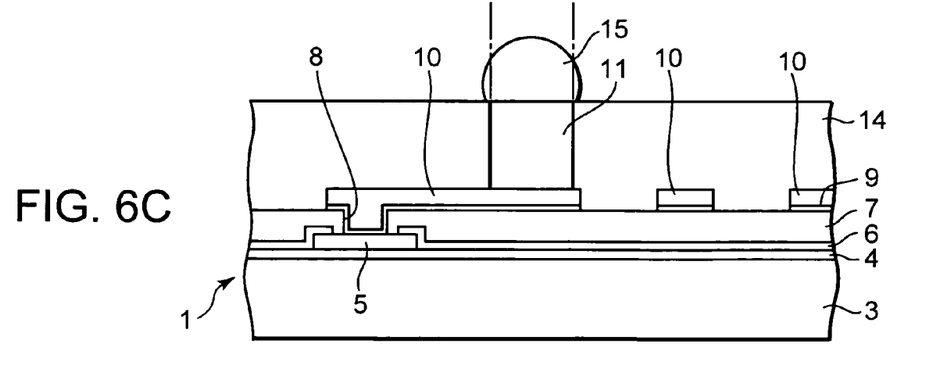

Since an operation at a subsequent process shown in FIG. 6C is similar to the operation at the process shown in FIG. 2C in the first embodiment, its description is omitted.

Thus, in the method for manufacturing the semiconductor device 2, according to the present embodiment, the easily dissoluble second resist mask 17 covers the entire surface excluding the electrode forming area 12 lying on the semiconductor wafer 1 in which the easily dissoluble first resist mask 16 is embedded between the redistribution wirings 10, prior to the attachment of the dry film 19. The dry film 19 is attached onto the second resist mask 17 to form the post electrode 11. After the removal of the dry film 19, the first resist mask 16 embedded between the redistribution wirings 10 and the second resist mask provided thereon are dissolved to remove the film residues. Therefore, even though the dry film is removed by the removal solvent friendly to the environment, the film residues are not sandwiched between the redistribution wirings 10. It is thus possible to prevent a short circuit produced by the bedding metal layer 9 lying between the redistribution wirings 10, which has remained due to a failure in etching of the bedding metal layer 9 with the removal thereof and to enhance the manufacturing yield of the semiconductor device 2. Along with it, the reliability of the semiconductor device 2 can be enhanced. Besides, a contribution to environmental protection at the manufacture of the semiconductor device 2 can be done.

This is particularly effective for a small CSP-type semiconductor device 2 in which narrowing between the redistribution wirings 10 has been done.

Since the entire upper surface of the semiconductor wafer 1 including each first resist mask 16 is covered with the second resist mask 17, the surface of the semiconductor wafer 1 to which the dry film 19 is attached can be planarized, and the adhesion of the dry film 19 to the semiconductor wafer 1 is enhanced, thereby making it possible to further improve the manufacturing yield of the semiconductor device 2.

In the present embodiment as described above, after the formation of the redistribution wirings extended on the insulating film via the bedding metal layer interposed therebetween, the first resist mask for forming each redistribution wiring is kept intact and the entire surface of the semiconductor wafer is covered with the second resist mask prior to the attachment of the dry film. After the removal of the dry film subsequent to the formation of the post electrode, the first and second resist masks are removed by the dissolving solution. Thus, an effect similar to the second embodiment can be obtained by dissolving the first and second resist masks. Along with it, the process of removing each first resist mask, prior to the formation of the second resist mask is omitted, thereby making it possible to simply the method of manufacturing the semiconductor device.

Incidentally, although the present embodiment has described that after the removal of the dry film, the first and second resist masks are removed, the first and second resist masks are dissolved with the dissolving solution without the removal of the dry film, and the dry film may be peeled off while being suspended from the semiconductor wafer. If done in this way, it is then possible to attain a further contribution to environmental protection by omitting the removal of the dry film by the removal solvent and to further simplify the method for manufacturing the semiconductor device.

Fourth Preferred Embodiment

FIG. 7A to FIG. 7E and FIG. 8A to FIG. 8C are respectively explanatory views showing a method for manufacturing a semiconductor device, according to a fourth embodiment.

Incidentally, the same reference numerals are respectively attached to portions similar to those in the first and second embodiments, and their explanations are omitted.

In FIG. 7A to FIG. 7E and FIG. 8A to FIG. 8C, reference numeral 21 indicates a redistribution wiring protective insulating film, which is a film shown with being hatched by broken lines in FIG. 7A to FIG. 7E and FIG. 8A to FIG. 8C and having a thickness ranging from about 5 μm to 10 μm, said film being formed by applying an insulating resin material such as polyimide having positive or negative photosensitivity and insulating properties onto an insulating film 7, subjecting the same to exposure and development processing to form an opening 22 in an electrode forming area 12 and thereafter solidifying the same by heat treatment.

Reference numeral 23 indicates a second bedding metal layer, which is a metal thin-film layer formed over the entire upper surface of the redistribution wiring protective insulating film 21 on the front surface side of a semiconductor substrate 3 of a semiconductor wafer 1 in a manner similar to the bedding metal layer 9 (called "first bedding metal layer 9" in the present embodiment) of the first embodiment. The second bedding metal layer 23 covers over the redistribution wiring protective insulating film 21 and over both the internal surface of the opening 22 in the electrode forming area 12 and a redistribution wiring 10 at its bottom, etc.

Therefore, a post electrode 11 employed in the present embodiment is formed on its corresponding exposed redistribution wiring 10 by an electroplating method with the second bedding metal layer 23 as one common electrode. An encapsulating or sealing layer 14 is formed so as to cover over the redistribution wiring protective insulating film 21 formed on the front surface side of the semiconductor substrate 3 of the semiconductor wafer 1, and the side surface of the post electrode 11.

The semiconductor device manufacturing method according to the present embodiment will be explained below in accordance with processes indicated by PC in FIG. 7A to FIG. 7E and FIG. 8A to FIG. 8C.

Figure 7A:
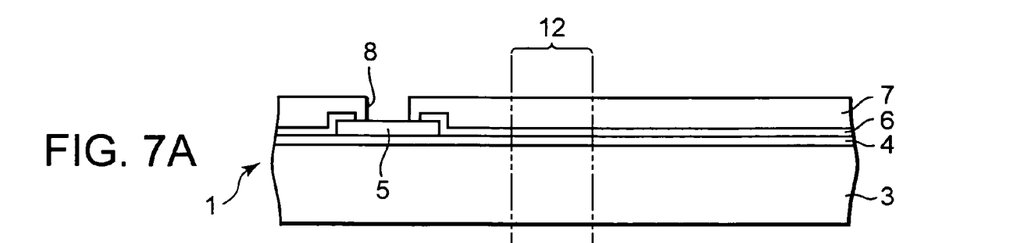
FIG. 7A to FIG. 7E are an explanatory view showing a method for manufacturing a semiconductor device according to a fourth embodiment.
Figure 7B:
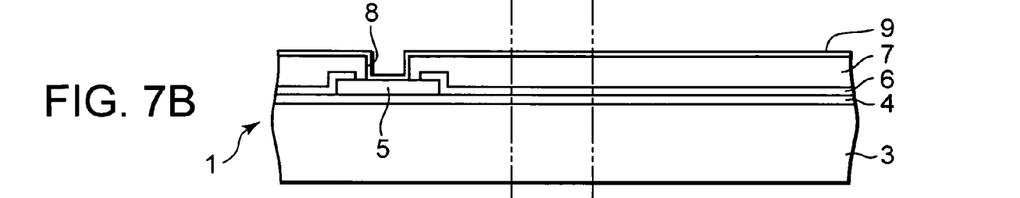
Figure 7C:
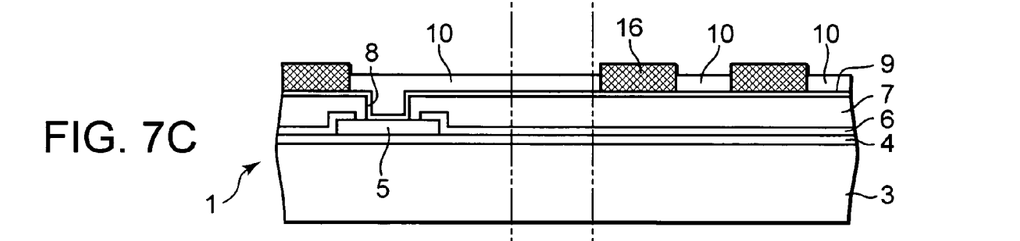

Since operations at processes shown in FIG. 7A through FIG. 7C in the present embodiment are similar to those at the processes FIG. 1A through FIG. 1C in the first embodiment, their explanations are omitted.

Figure 7D:
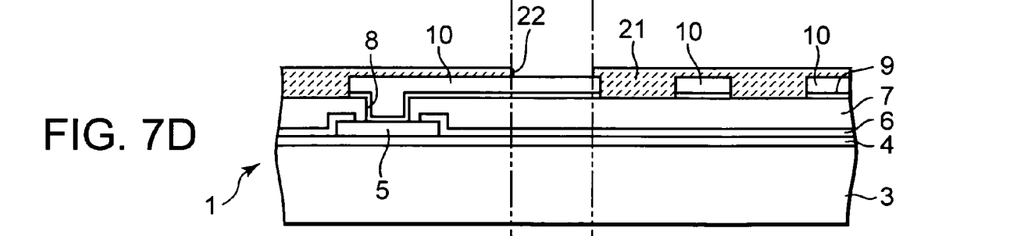

At FIG. 7D, each first resist mask 16 formed at the process shown in FIG. 7C is removed using a dissolving solution. An exposed first bedding metal layer 9 is removed except for an area located below each redistribution wiring 10 in a manner similar to the process shown in FIG. 2C in the first embodiment. An insulating resin material comprised of polyimide having photosensitivity is applied onto an exposed insulating film 7 and each redistribution wiring 10, after which an opening 22 that extends through a redistribution wiring protective insulating film 21 and reaches an electrode forming area 12 placed on the corresponding redistribution wiring 10 is formed by photolithography. This is solidified by heat treatment to form the corresponding redistribution wiring protective insulating film 21.

Thus, the redistribution wiring protective insulating film 21 is embedded between the adjacent redistribution wirings 10, and the corresponding redistribution wiring protective insulating film 21 is formed over the entire surface except for the electrode forming area 12 on the front surface side of a semiconductor wafer 1.

Figure 7E:
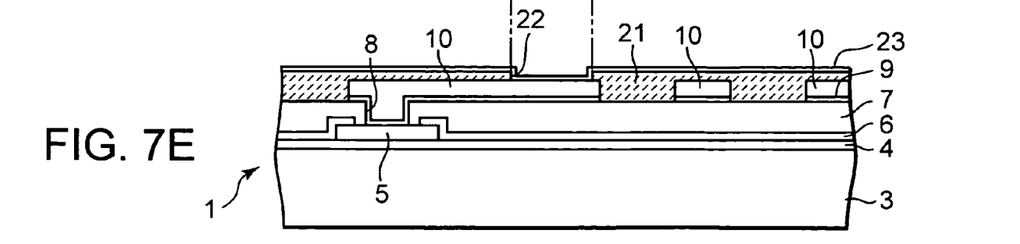

At FIG. 7E, a second bedding metal layer 23 comprising plural layers, which covers over the redistribution wiring protective insulating film 21 and covers the internal surface of the opening 22 containing over the redistribution wiring 10 at its bottom, is formed on the redistribution wiring protective insulating film 21 on the front surface side of a semiconductor substrate 3 in the semiconductor wafer 1 by a sputtering method.

Figure 8A:
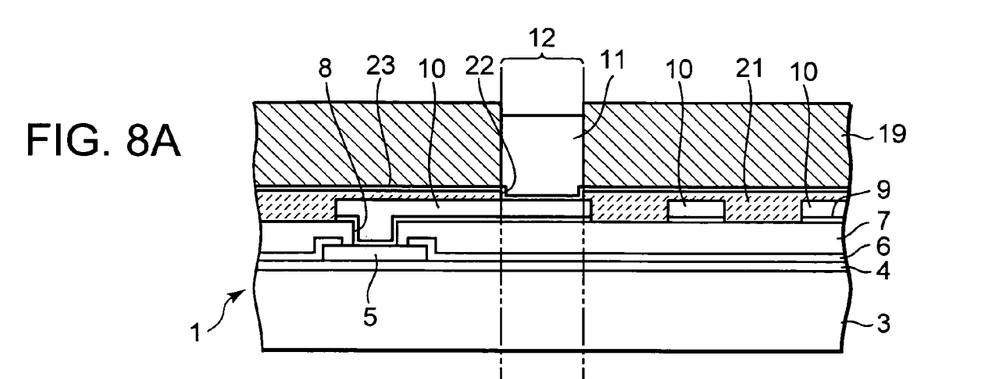
FIG. 8A to FIG. 8C are an explanatory view illustrating the method for manufacturing the semiconductor device according to the fourth embodiment.
Figure 8B:
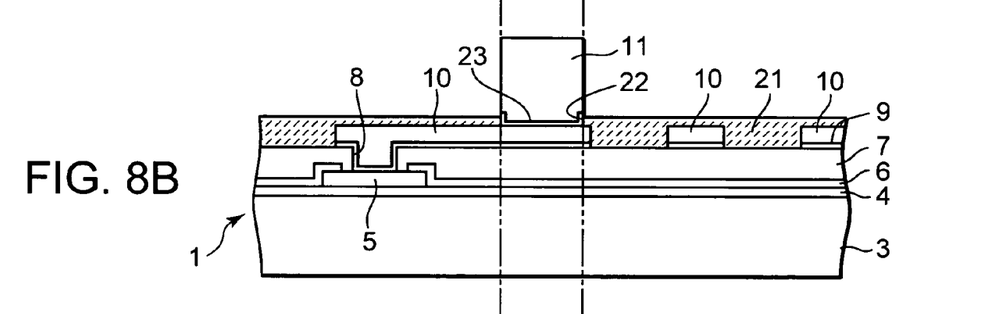

At FIG. 8A, a dry film 19 having photosensitivity is attached onto the redistribution wiring protective insulating film 21. The electrode forming area 12 for a post electrode 11 provided on its corresponding redistribution wiring 10 is exposed by photolithography. With it as a mask, copper is electrodeposited on the exposed redistribution wiring 10 by an electroplating method with the second bedding metal layer 23 as on common electrode to form the corresponding post electrode 11.

Figure 8C:
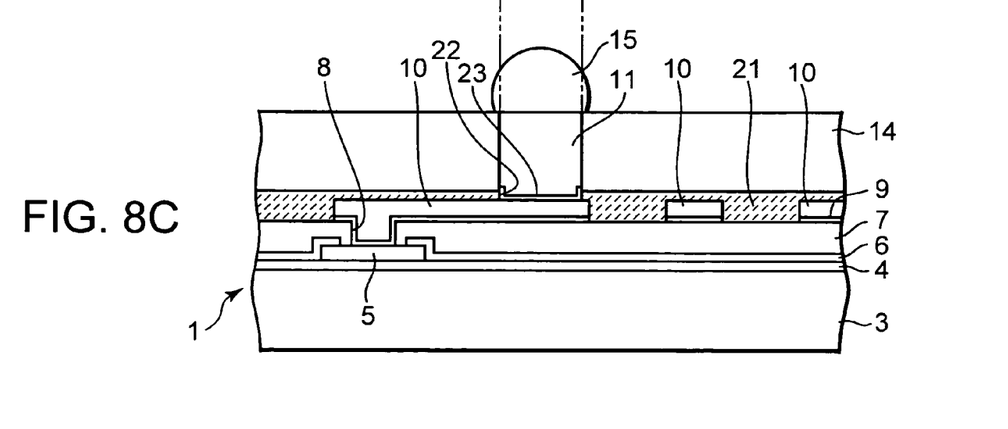

At FIG. 8C, the dry film 19 is removed using a removal solvent. The entire surface on the front surface side of the semiconductor substrate 3 of the semiconductor wafer 1 is etched by wet etching to remove the second bedding metal layer 23 in the area excluding below the post electrode 11, after which cleaning is done to remove film residues.

Since, at this time, the redistribution wiring protective insulating film 21 is embedded between the redistribution wirings 10, and the redistribution wiring protective insulating film 21 covers over the redistribution wirings 10 and covers the neighborhood of the base of each post electrode 11, the film residues are not sandwiched mechanically between the redistribution wirings 10. Even though the film residues are adhered onto the second bedding metal layer 23 relatively wide in area, the film residues don not remain in the mechanically sandwiched state and are removed by dissolution of the second bedding metal layer 23. Further, the film residues do not remain over the bedding metal layer 9 lying between the redistribution wirings 10, in the neighborhood of the base of the post electrode 11 at its outer peripheral surface, and over the redistribution wiring protective insulating film 21. The film residues attached to other portions are also removed by cleaning.

At FIG. 8C, after the removal of the second bending metal layer 23, an encapsulating or sealing resin made of a thermosetting epoxy resin is applied or injected so as to cover the entire surface on the front surface side, of the semiconductor substrate 3 of the semiconductor wafer 1, that is, to cover over the redistribution wiring protective insulating film 21 and cover the post electrode 11 or the like. This is heated and cured to form a sealing layer 14. The front surface side of the sealing layer 14 is ground to expose the post end surface of the post electrode 11 to the front surface of the sealing layer 14.

Flux is applied onto the post end surface exposed to the front surface of the sealing layer 14 to form a bump electrode 15 protruded in hemispherical form on the post end surface by a solder ball method.

Since subsequent operations are similar to those in the first embodiment, their explanations are omitted.

Thus, in the method for manufacturing the semiconductor device 2 according to the present embodiment, the first bedding metal layer 9 excluding below each redistribution wiring 10 is removed prior to the attachment of the dry film 19, The whole surface excluding the electrode forming area 12 disposed over the semiconductor wafer 1 is covered with the redistribution wiring protective insulating film 21. The second bedding metal layer is formed thereon. Thereafter, the dry film 19 is attached to form the post electrode 11. After the removal of the dry film, the second bedding metal layer provided on the redistribution wiring protective insulating film 21 embedded between the redistribution wirings 10 is dissolved by etching to remove the film residues. Therefore, even though the dry film is removed by the removal solvent friendly to the environment, the film residues are not sandwiched between the redistribution wirings 10. It is thus possible to prevent a short circuit produced by the first bedding metal layer 9 lying between the redistribution wirings 10, which has remained due to a failure in etching of the first bedding metal layer 9 with the removal thereof and to enhance the manufacturing yield of the semiconductor device 2. Along with it, the reliability of the semiconductor device 2 can be enhanced. Besides, a contribution to environmental protection at the manufacture of the semiconductor device 2 can be attained.

This is particularly effective for a small CSP-type semiconductor device 2 in which narrowing between the redistribution wirings 10 has been done.

Since the entire upper surface of the semiconductor wafer 1 is covered with the redistribution wiring protective insulating film 21 and the second bedding metal layer is formed thereon, the surface of the semiconductor wafer 1 to which the dry film 19 is attached can be planarized, and the adhesion of the dry film 19 to the semiconductor wafer 1 is enhanced, thereby making it possible to further improve the manufacturing yield of the semiconductor device 2.

Further, since the sealing layer 14 is formed after the removal of the second bedding metal layer 23 provided on the redistribution wiring protective insulating film 21, the sealing layer 14 can be formed on the redistribution wiring protective insulating film 21 made of polyimide excellent in adhesion to the sealing resin, thus making it possible to obtain the semiconductor device 2 excellent in moisture resistant reliability.

Thus, since the sealing layer 14 is formed on the redistribution wiring protective insulating film 21 which covers between the redistribution wirings 10 and over the redistribution wirings 10, the semiconductor device 2 according to the present embodiment is capable of enhancing adhesion between the redistribution wring protective insulating film 21 and the sealing layer 14 and preventing external intrusion of moisture thereby to enable an improvement in its moisture resistance reliability.

In the present embodiment as described above, after the formation of each redistribution wiring extended over the insulating film via the bedding metal layer interposed therebetween, the entire surface of the semiconductor wafer is covered with the redistribution wiring protective insulating film prior to the attachment of the dry film, and the second bedding metal layer is formed thereon. After the removal of the dry film subsequent to the formation of the post electrode, the second bedding metal layer placed on the redistribution wiring protective insulating film is removed by etching. Thus, the film residues are prevented from being sandwiched between the redistribution wirings, and the second bedding metal layer placed on the redistribution wiring protective insulating film is dissolved to enable easy removal of the film residues adhered thereon. Further, a short circuit produced by the first bedding metal layer which has remained between the redistribution wirings, is prevented, thereby making it possible to enhance the reliability of the semiconductor device.

Incidentally, although the present embodiment has described that the redistribution wiring protective insulating film is of the insulating resin material such as polyimide having the photosensitivity, an insulating resin material such as polyimide with no photosensitivity may be used. In this case, the opening defined in the electrode forming area may be formed by plasma etching or the like after the insulating resin material is applied and cured.

Although each of the above embodiments has described that the insulating film is of the insulating resin material such as polyimide having the photosensitivity, an insulating resin material such as polyimide with no photosensitivity may be adopted. In this case, each through hole may be formed by plasma etching or the like after the insulating resin material is applied and cured.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor device including a semiconductor substrate, an electrode pad electrically connected to an internal circuit formed in the semiconductor substrate, an insulating film formed with a through hole reaching the electrode pad, a bedding metal layer formed over an internal surface of the through hole and the insulating film, a redistribution wiring electrically connected to the electrode pad via the bedding metal layer interposed therebetween and extended over the bedding metal layer, and a post electrode formed over the redistribution wiring, said method comprising the steps of:

preparing a semiconductor wafer including the electrode pad, the insulating film formed with the through hole and the bedding metal layer which are formed in the semiconductor substrate;

forming a first resist mask which exposes each area for forming the redistribution wiring, over the bedding metal layer;

forming a redistribution wiring connected to the electrode pad and extending in an electrode forming area for the post electrode with the first resist mask as a mask;

removing the first resist mask by a dissolving solution to expose each area excluding the electrode forming area for the redistribution wiring and forming a second resist mask disposed with being separated from each side surface of the redistribution wiring;

forming a redistribution wiring protective metal film over upper and side surfaces of the exposed redistribution wiring with the second resist mask as a mask;

removing the second resist mask by a dissolving solution, attaching a dry film over the semiconductor wafer and exposing the electrode forming area lying over the redistribution wiring;

forming a post electrode in the electrode forming area with the dry film as a mask;

removing the dry film by a removal solvent; and removing the redistribution wiring protective metal film after the removal of the dry film.

2. A method for manufacturing a semiconductor device including a semiconductor substrate, an electrode pad electrically connected to an internal circuit formed in the semiconductor substrate, an insulating film formed with a through hole reaching the electrode pad, a bedding metal layer formed over an internal surface of the through hole and the insulating film, a redistribution wiring electrically connected to the electrode pad via the bedding metal layer interposed therebetween and extended over the bedding metal layer, and a post electrode formed over the redistribution wiring, said method comprising the steps of:

preparing a semiconductor wafer including the electrode pad, the insulating film formed with the through hole and the bedding metal layer which are formed in the semiconductor substrate;

forming a first resist mask which exposes each area for forming the redistribution wiring, over the bedding metal layer;

forming a redistribution wiring connected to the electrode pad and extending in an electrode forming area for the post electrode with the first resist mask as a mask;

removing the first resist mask by a dissolving solution and forming a second resist mask which covers the bedding metal layer between the redistribution wirings narrow in wiring interval, exposes the electrode forming area lying over the corresponding redistribution wiring and covers an area for a base of the electrode post at a periphery thereof;

attaching a dry film over the semiconductor wafer including the second resist mask and thereby exposing the electrode forming area lying over the corresponding redistribution wiring;

forming a post electrode in the electrode forming area with the dry film as a mask;

removing the dry film by a removal solvent; and removing the second resist mask by a dissolving solution after the removal of the dry film.

3. A method for manufacturing a semiconductor device including a semiconductor substrate, an electrode pad electrically connected to an internal circuit formed in the semiconductor substrate, an insulating film formed with a through hole reaching the electrode pad, a bedding metal layer formed over an internal surface of the through hole and the insulating film, a redistribution wiring electrically connected to the electrode pad via the bedding metal layer interposed therebetween and extended over the bedding metal layer, and a post electrode formed over the redistribution wiring, said method comprising the steps of:

preparing a semiconductor wafer including the electrode pad, the insulating film formed with the through hole and the bedding metal layer which are formed in the semiconductor substrate;

forming a first resist mask which exposes each area for forming the redistribution wiring, over the bedding metal layer;

forming a redistribution wiring connected to the electrode pad and extending in an electrode forming area for the post electrode with the first resist mask as a mask;

forming a second resist mask which exposes the electrode forming area lying over the redistribution wiring, over the semiconductor wafer including the first resist mask;

attaching a dry film over the second resist mask and thereby exposing the electrode forming area lying over the redistribution wiring;

forming a post electrode in the electrode forming area with the dry film as a mask;

removing the dry film by a removal solvent; and removing the first and second resist masks by a dissolving solution after the removal of the dry film.

4. The method according to claim 3, further including, in place of the dry film removing step and the step of removing the first and second resist masks, a step of dissolving the first and second resist masks by a dissolving solution to peel off the dry film.

* * * * *